United States Patent [19]

Patterson, III

[11] 4,446,444

[45] May 1, 1984

[54] CMOS AMPLIFIER

[75] Inventor: Raymond B. Patterson, III, Melbourne, Fla.

[73] Assignee: Harris Corporation, Melbourne, Fla.

[21] Appl. No.: 231,672

[22] Filed: Feb. 5, 1981

[51] Int. Cl.³ .......................... H03F 3/18; H03F 3/16
[52] U.S. Cl. .................................. 330/264; 330/288; 330/300
[58] Field of Search ............... 330/253, 264, 277, 288, 330/296, 300; 307/448, 450

[56] References Cited

U.S. PATENT DOCUMENTS

| 3,900,746 | 8/1975 | Kraft et al. | |
|---|---|---|---|
| 3,914,702 | 10/1975 | Gehweiler | |
| 4,038,607 | 7/1976 | Schode, Jr. | 330/264 |
| 4,128,775 | 12/1978 | Frederiksen et al. | |
| 4,297,644 | 10/1981 | Ahmed | 330/264 |

FOREIGN PATENT DOCUMENTS

| 2531208 | 2/1976 | Fed. Rep. of Germany | 330/288 |
|---|---|---|---|
| 55-107309 | 8/1980 | Japan | 330/277 |

Primary Examiner—James B. Mullins
Assistant Examiner—Gene Wan
Attorney, Agent, or Firm—Leitner, Palan, Martin & Bernstein

[57] ABSTRACT

An amplifier circuit including a FET inverter with its N channel device being part of the controlled leg of a first current mirror, and its P channel device being part of the controlled leg of a second current mirror. The operating point of the inverter is the reference signal applied on the input to the current mirrors.

10 Claims, 4 Drawing Figures

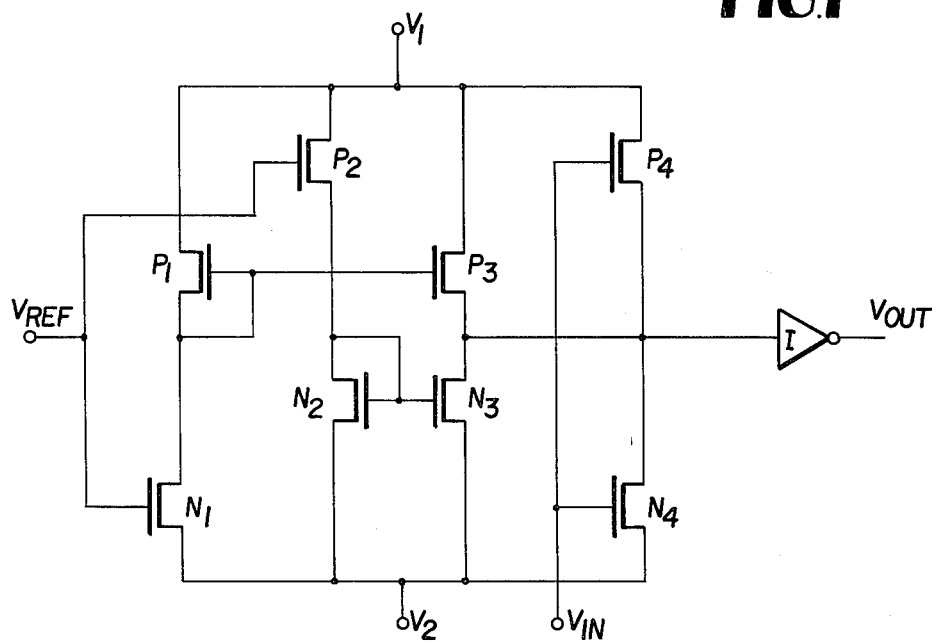
FIG.1
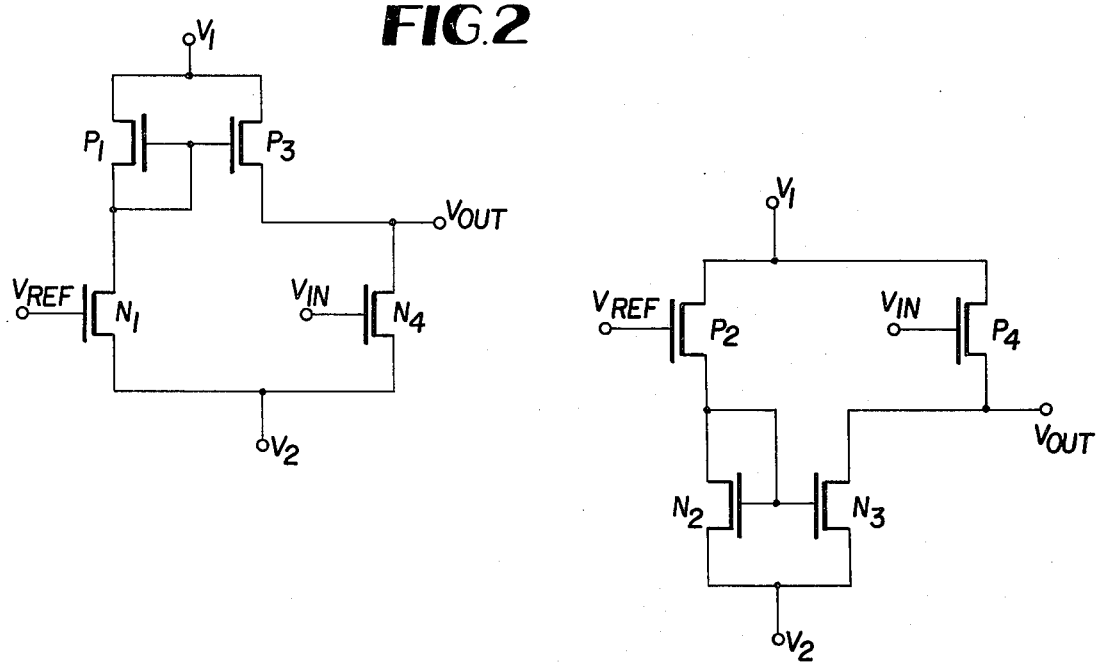
FIG.2
FIG.3

CMOS AMPLIFIER

BACKGROUND OF THE INVENTION

The present invention relates generally to amplifier circuits and more specifically to complementary metal oxide semiconductor (CMOS) insulated gate field effect transistor linear amplifier circuits.

It is known that a complementary field effect transistor (FET) inverter may be used as an analog amplifier when suitably biased. Such amplifiers, however, have not found wide use in analog applications because of the difficulty of biasing a complementary FET inverter to a suitable operating point. The reason for this difficulty is that the input-output transfer function associated with such amplifiers is characterized in having a relatively narrow region where the output signal changes appreciably in response to changes in the input signal. This is a distinct advantage in digital applications where the resulting insensitivity to signals outside the narrow region provides the amplifier (inverter) with exceptionally high noise immunity compared to other logic families. On the other hand, this relatively narrow region of the transfer function requires precise control of applied bias when a complementary FET inverter is used in analog applications as an amplifier, and precision is difficult to achieve due to the relatively unpredictable nature of the transfer function concerned. This results from many factors including primarily manufacturing mismatch between the P and N channel devices. One method of compensating a CMOS inverter for variations is to include variable resistive elements in series with the P channel device and in series with the N channel device which may be controlled inversed to each other to reach a balance. This method is illustrated in U.S. Pat. No. 3,914,702 to Gehweiler. Although Gehweiler improves the accuracy of the operating point of the inverter, it adds resistance to each of the current paths and thus consequently slows the response time of the inverter.

Thus there exists a need for an amplifier circuit using a CMOS inverter as the output stage which has a fixed operating point and improved response time.

SUMMARY OF THE INVENTION

An object of the present invention is to provide an amplifier circuit with improved response time.

Another object of the present invention is to provide an amplifier circuit with a stable operating point.

A further object of the present invention is to provide a field effect transistor amplifier which has an improved response time and a determinable operating point.

Still another object of the present invention is to provide a field effect transistor amplifier which has a determinable operating point and is self-compensating for manufacturing tolerances.

An even further object of the present invention is to provide an amplifier which can operate with low power supply voltage, for example 1.5 volts or less.

A still further object of the present invention is to provide an improved CMOS operational amplifier.

These and other objects of the invention are attained by an amplifier circuit having a CMOS inverter with its N channel device being part of a controlled leg of a first current mirror and its P channel device being part of a controlled leg of a second current mirror. The other portion of the controlled leg of the first current mirror is connected in series with the N channel device and in parallel with the P channel device and operates as a variable current source responsive to the controlling leg. The other portion of the controlled leg of the second current mirror is connected in series with a P channel device and in parallel with the N channel device and operates as a variable current sink responsive to the controlling leg. The controlling legs of the first and second current mirrors include a reference input. The elements of the circuit are sized or designed such that the operating point of the inverter is the voltage on the reference input.

An operational amplifier may be provided by cascading two additional CMOS output inverters to the output of the CMOS inverter. The first additional inverter includes a capacitance connected between its input and output to form the dominant frequency band width determining stage. The second additional inverter is formed using large devices to drive loads and isolate the previous stages from the output. The input of the inverter is the inverting input of the operational amplifier, the reference input is the non-inverting input and the output of the second additional inverter is the output of the operational amplifier.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic of an amplifier circuit incorporating the principles of the present invention.

FIG. 2 is a schematic of a first current mirror of the circuit of FIG. 1.

FIG. 3 is a schematic of a second current mirror portion of the circuit of FIG. 1.

DESCRIPTION OF THE PREFERRED EMBODIMENTS

Figure 4:
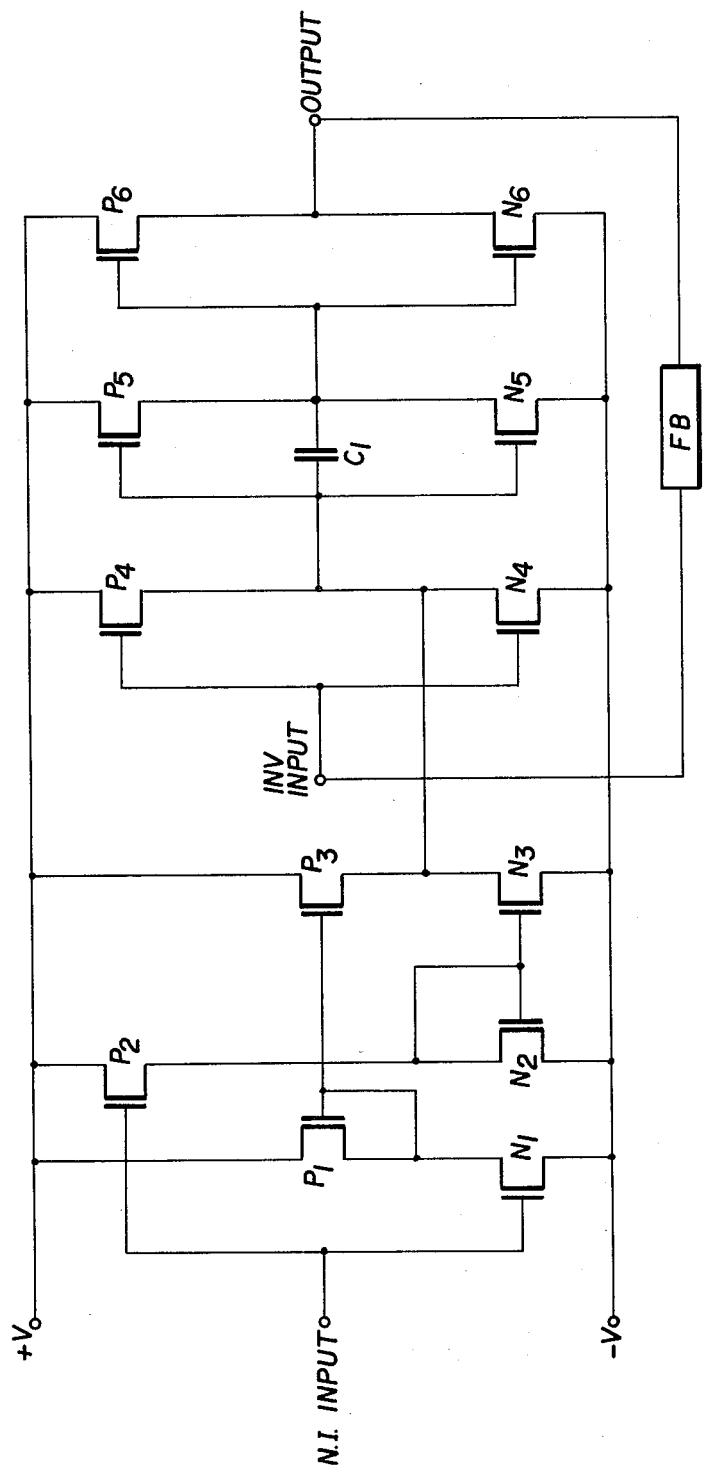
FIG. 4 is a schematic of an operational amplifier incorporating the principles of the present invention.

An amplifier circuit is shown in FIG. 1 as including a complementary insulated gate field effect transistor inverter having a P channel device P4 and an N channel device N4 with their conduction paths connected in series between supply terminals V1 and V2. The input terminal VIN of the interface circuit is connected to the gates of the devices P4 and N4 which is the input to the inverter and the output terminal VOUT is connected to the drain connection of devices N4 and P4 which is the output of the inverter. An inverter I is illustrated as the load connected to the output terminal VOUT. Connected in parallel with inverter device P4 is field effect transistor P3. The source of P3 is connected to the supply terminal V1 and the drain is connected to the output terminal VOUT. The gate of P3 is connected to a biasing circuit. Connected in parallel with inverter device N4 is field effect transistor N3. The source of N3 is connected to the supply terminal V2 and the drain is connected to the output terminal VOUT. The gate of N3 is connected to a biasing circuit.

The biasing circuit for the gate of device P3 includes the series combination of field effect transistors P1 and N1. The source of P1 is connected to the supply terminal V1, the source of N1 is connected to supply terminal V2, the gate of P1 is connected to its drain and the gate of device N1 is connected to the reference input terminal VREF. The biasing circuit for the gate of N3 includes the series combination of field effect transistor P2 and N2. The source of P2 is connected to the supply voltage V1, the source of N2 is connected to the supply voltage V2, the gate of N2 is connected to its drain and the gate of P2 is connected to the reference input terminal VREF.

The devices of the amplifier circuit are selected such that the operating point of the inverter including devices N4 and P4 is such that when the signal at VIN equals the signal at VREF, the output voltage VOUT has an amplitude midway between the supply voltages at terminals V1 and V2. Thus at the operating point, the current being sunk by N4 of the inverter must be equal to the current being generated by P3 and the current being generated by the inverter device P4 is being sunk by device N3.

As the input voltage at VIN begins to go below the operating point or the signal at reference terminal REF, device P4 of the inverter supplies greater current while device N4 of the inverter has its current sinking capacity reduced. Thus the voltage at the output terminal VOUT raises as the current is used to drive the output load I. It should also be noted that since the current sink N3 and the current source P3 are not in series with the output and the main driving device P4, no additional resistance is added which would reduce the driving current:

As the input signal VIN goes above the operating point of the signal on terminal VREF, inverter device N4 will sink more current than before while the inverter device P4 provides less current to the output. Consequently the voltage at the output terminal VOUT falls as substantial current is sunk from the load I. Since the current sink N3 and the current source P3 are not in the series circuit with the main sinking device N4 of the inverter and the output load, no additional resistance is added to the output circuitry.

To compensate for design mismatch of the devices of P4 and N4 in the inverter, the biasing circuit for device P3 is connected to constitute a current mirror as illustrated in FIG. 2 and the biasing circuit for N3 is connected as a second current mirror as illustrated in FIG. 3. The first current mirror illustrated in FIG. 2 has a controlling leg including devices P1 and N1 and a controlled leg including devices P3 of the current source and N4 of the inverter. Interconnection of the gates of P1 and P3 of the controlling and controlled leg, respectively, to the drain of P1 form the current mirror. The current flowing into the drain of P1 will produce a gate to source voltage on P3 that will produce drain current in P3 equal to the drain current of P1. Thus if P1 and N1 are built to match P3 and N4, respectively, the two legs will be balanced. Since the operating point of the inverter is defined as VIN equals VREF, the current through N1 and N4 should also be identical at the operating point. Any mismatch which occurs during processing usually is mismatched between the N channel devices and the P channel devices. If, for example, the P channel devices as a result of manufacturing have a greater conductance than the N channel devices, the voltage at the drain of P1 will increase. This voltage increase which is applied to the gate of P3 will lower the transconductance of P3. Thus the transconductance of the current source including P3 has been reduced to match the reduced transconductance of N4 and the controlled leg is balanced. Conversely, if the N channel devices have a greater transconductance than the P channel devices, the voltage on the drain of P1 and the gate of P3 will decrease thereby increasing the transconductance of P3 to match that of N4. Thus the current mirror structure, wherein the controlled leg includes a current source P3 and the N channel device N4 of the inverter, is self-compensating for manufacturing variances.

A second current mirror is illustrated in FIG. 3 as including a controlling leg including devices P2 and N2 and a controlled leg including the current sink N3 and the P channel device P4 of the inverter. The drain of the device N2 is connected to the common connection of the gates N2 and N3 and constitutes a current mirror arrangement. The current flowing into the drain N2 will produce a gate to source voltage on N3 that will produce a drain current in N3 equal to the drain current of N2. The devices P2 and N2 of the controlling legs are matched to the devices P4 and N3 of the controlled leg, respectively. As with the current mirror of FIG. 2, the current mirror of FIG. 3 provides self-compensation for variance in the transductance of the P and N channel devices resulting from the manufacturing processes and thus additional description of the compensation is not necessary.

The design of the parameters of the devices is predicated upon the requirement that the voltage at the output VOUT should be midway between the values of the supply voltages V1 and V2 when the input voltage is at VREF. This defines the operating point as VREF. Knowing these requirements, the appropriate size of the devices may be calculated.

A circuit incorporating the improvements of the inverter in FIG. 1 in an operational amplifier is illustrated in FIG. 4. The insulated gate field effect transistors P1 through P4 and N1 through N4 are connected as shown and function as described for FIG. 1. Connected to the output of the inverter P4 and N4 at the drain connection therebetween are a pair of cascaded complementary insulated gate field effect transistor inverters. The first additional inverter includes P5 and N5 having their source to drain paths connected between the supply voltage +V and −V. The input of the first additional inverter which is the gates of P5 and N5 is connected to the output or the common drain connection of P4 and N4. The capacitor C1 is connected between the inputs and the outputs or between gates and the drain connections of P5 and N5. This causes the first additional inverter to be the dominant frequency bandwidth determining stage.

The second additional inverter includes insulated gate field effect transistors P6 and N6 having their source to drain paths connected between supply voltages +V and −V. The input or the common gate connection of P6 and N6 is connected to the output or the drain connection of the first additional inverter P5 and N5. The output of the operational amplifier is the output of the second additional inverter P6 and N6 which is the common drain connection. The second additional inverter or final output stage is constructed with large CMOS devices suited to driving a specific load. By the use of large devices, the gain and bandwidth determining stages are isolated from the effects of the output load. A feedback impedance FB is connected between the output of the final stage P6 and N6 and the input to the first inverter P4 and N4 which is the inverting input of the operational amplifier. This is also the input VIN of FIG. 1. The reference input VREF of FIG. 1 is the non-inverting input of the operational amplifier of FIG. 4 and is connected to the gates of N1 and P2.

Thus, it can be seen that the improved complementary insulated gate field effect inverter of FIG. 1 may be part of an operational amplifier and incorporates its improved characteristics therewith.

It is evident from the preceding description of the present invention that the objects of the invention are attained in that an amplifier circuit is provided which is self-compensating for manufacturing techniques, has a determinate operating point, and has improved response time. Although the invention has been described and illustrated in detail, it is clearly understood that the same is by way of illustration and example only and is not to be taken by way of limitation. The spirit and scope of this invention are to be limited only by the terms of the appended claims.

What is claimed:

1. An amplifier circuit having a signal input terminal, a reference terminal and a signal output terminal comprising:
    a complementary field effect transistor inverter having an N and P channel device connected between a pair of supply terminals with the input terminal of the circuit being the input of said inverter and the output terminal of said circuit being the output of said inverter;
    a first complementary field effect transistor current mirror means connected between said pair of supply terminals and including an N channel device having its source-drain path connected in a controlling leg and said reference terminal being connected to its gate and said inverter N channel device having its source-drain path connected in a controlled leg of said first current mirror means; and
    a second complementary field effect transistor current mirror connected between said pair of supply terminals and including a P channel device having its source-drain path connected in a controlling leg and said reference terminal being connected to its gate and said inverter P channel device having its source-drain path connected in a controlled leg of said second current mirror means.

2. An amplifier circuit according to claim 1 wherein said controlled legs of said first and second current mirror means are designed to define the operating point of said inverter equal to the signal of said reference terminal.

3. An amplifier circuit according to claim 1 wherein said first current mirror means includes a P channel device in said controlling leg having its drain connected to its gate and a P channel device in said controlled leg having its gate connected to said drain of said P channel device of said controlling leg, and said second current mirror means includes an N channel device in said controlling leg having its drain connected to its gate and an N channel device in said controlled leg having its gate connected to said drain of said N channel device of said controlling leg.

4. An amplifier circuit having an input terminal and output terminal comprising:
    a complementary field effect transistor inverter having an N and P channel device connected between a pair of supply terminals with the input terminal of the circuit being the input of said inverter and the output terminal of the circuit being the output of said inverter;
    a current source means in series with the source-drain conduction path of said N channel device and in parallel with said P channel device for providing current for said N channel device;
    a current sink means in series with the source-drain conduction path of said P channel device and in parallel with said N channel device for providing a sink of current from said P channel device; and
    said current source means and said current sink means operate to increase the response time of said inverter.

5. An interface circuit according to claim 4 including a reference input terminal and biasing means interconnecting said reference input to said current source means and said current sink means for defining the operating point of said inverter.

6. An interface circuit according to claim 4 wherein said current source means is designed to provide current equal to the sink current capacity of said N channel device when said circuit input equals said reference input, and said current sink means is designed to sink current equal to the current generated by said P channel device when said circuit input equals said reference input.

7. An operation amplifier circuit having an inverting input terminal, a non-inverting input terminal and a signal output terminal comprising:
    a first complementary field effect transistor inverter having an N and P channel device connected between a pair of supply terminals with the inverting input terminal of the circuit being the input of said inverter;
    a first complementary field effect transistor current mirror means connected between said pair of supply terminals and including an N channel device having its source-drain path connected in a controlling leg and said reference terminal being connected to its gate and said inverter N channel device having its source-drain path connected in a controlled leg of said first current mirror means;
    a second complementary field effect transistor current mirror means connected between said pair of supply terminals and including a P channel device having its source-drain path connected in a controlling leg and said reference terminal being connected to its gate and said inverter P channel device having its source-drain path connected in a controlled leg of said second current mirror means;
    a second complementary field effect transistor inverter having an N and P channel device connected between said pair of supply terminals, its inputs connected to the output of said first inverter and a capacitance connected between said second inverter's input and output;
    a third complementary field effect transistor inverter having an N and P channel device connected between said pair of supply terminals, its input connected to the output of said second inverter, and the output terminal of said circuit being the output of said third inverter; and
    feedback means connecting the output of said third inverter to the input of said first inverter.

8. The operational amplifier according to claim 7 wherein said N and P channel devices of said third inverter are larger than said N and P channel devices of said first and second inverters to buffer said first and second inverters from the output load.

9. An operational amplifier circuit having an inverting input terminal and output terminal comprising:
- a first complementary field effect transistor inverter having an N and P channel device connected between a pair of supply terminals with the input terminal of the circuit being the input of said inverter;
- a current source means in series with the source-drain conduction path of said N channel device and in parallel with said P channel device for providing current for said N channel device;
- a current sink means in series with the source-drain conduction path of said P channel device and in parallel with said N channel device for providing a sink of current from said P channel device;
- a second complementary field effect transistor inverter having an N and P channel device connected between said pair of supply terminals, its input connected to the output of said first inverter and a capacitance connected between said second inverter's input and output;
- a third complementary field effect transistor inverter having an N and P channel device connected between said pair of supply terminals, its input connected to the output of said second inverter and the output terminal of said circuit being the output of said third inverter; and
- feedback means connecting the output of said third inverter to the input of said first inverter.

10. The operational amplifier according to claim 9 wherein said N and P channel devices of said third inverter are larger than said N and P channel devices of said first and second inverters to buffer said first and second inverters from the output load.

* * * * *

UNITED STATES PATENT AND TRADEMARK OFFICE
CERTIFICATE OF CORRECTION

PATENT NO. : 4,446,444
DATED : May 1, 1984
INVENTOR(S) : Raymond B. Patterson, III It is certified that error appears in the above—identified patent and that said Letters Patent is hereby corrected as shown below:

Column 3, line 24, after "current" delete the colon and insert a period.

Column 4, line 44, insert a comma after "inverter" and "N5".

Claim 7, line 1, delete "operation" and insert --operational--.

line 53, delete "inputs" and insert --input--.

Signed and Sealed this

Sixth Day of November 1984

[SEAL]

Attest:

GERALD J. MOSSINGHOFF

*Attesting Officer*      *Commissioner of Patents and Trademarks*